United States Patent
Solon

(10) Patent No.: US 9,847,196 B2
(45) Date of Patent: Dec. 19, 2017

(54) MASTER RECOMBINER BOX WITH WIRELESS MONITORING CAPABILITY

(71) Applicant: Dean Solon, Gallatin, TN (US)

(72) Inventor: Dean Solon, Gallatin, TN (US)

(73) Assignee: Shoals Technologies Group, LLC, Portland, TN (US)

( * ) Notice: Subject to any disclaimer, the term of this patent is extended or adjusted under 35 U.S.C. 154(b) by 326 days.

(21) Appl. No.: 14/269,095

(22) Filed: May 3, 2014

(65) Prior Publication Data
US 2014/0328026 A1 Nov. 6, 2014

Related U.S. Application Data

(60) Provisional application No. 61/818,940, filed on May 3, 2013.

(51) Int. Cl.
| | | |
|---|---|---|
| *H05K 5/00* | (2006.01) | |
| *H01H 47/00* | (2006.01) | |
| *H01H 71/10* | (2006.01) | |
| *H01H 71/56* | (2006.01) | |

(52) U.S. Cl.
CPC ...... *H01H 47/002* (2013.01); *H01H 71/1018* (2013.01); *H05K 5/0004* (2013.01); *H05K 5/0017* (2013.01); *H01H 71/56* (2013.01); *Y10T 29/49117* (2015.01); *Y10T 307/747* (2015.04)

(58) Field of Classification Search
CPC .. H05K 5/0017; H05K 5/0004; H04K 5/0004; H01H 47/002; H01H 71/1018; H01H 71/56
See application file for complete search history.

(56) References Cited

U.S. PATENT DOCUMENTS

| | | | | |
|---|---|---|---|---|
| 6,593,520 | B2 * | 7/2003 | Kondo | H01L 31/02021 |
| | | | | 136/244 |
| 8,847,614 | B2 * | 9/2014 | Debone | G01R 21/06 |
| | | | | 324/600 |
| 9,131,620 | B2 * | 9/2015 | Debone | H05K 7/1432 |
| 2006/0237058 | A1 * | 10/2006 | McClintock | H02J 7/35 |
| | | | | 136/244 |
| 2009/0207543 | A1 * | 8/2009 | Boniface | H02H 3/16 |
| | | | | 361/86 |
| 2009/0302680 | A1 * | 12/2009 | Kernahan | H02J 3/383 |
| | | | | 307/43 |
| 2010/0237703 | A1 * | 9/2010 | Stern | H02S 10/00 |
| | | | | 307/77 |
| 2011/0141644 | A1 * | 6/2011 | Hastings | H01L 31/02021 |
| | | | | 361/93.2 |
| 2011/0209741 | A1 * | 9/2011 | Solon | H01H 85/0241 |
| | | | | 136/244 |

(Continued)

*Primary Examiner* — Nathan Milakovich
(74) *Attorney, Agent, or Firm* — Carla Gannon Law

(57) ABSTRACT

A master recombiner box system includes a plurality of input bus bars that receive power from a corresponding combiner box in a solar field. Each input bus bar is coupled with a current transducer, thereby measuring the current of the associated combiner box. Power feeding into the plurality of input bus bars is combined at a recombiner bus bar, which leads to an output bus bar, and ultimately to an external inverter. The current transducers are linked to a control circuit board which utilizes an antenna to send RF signals to a receiver. In this manner individual combiner boxes in a solar field can be monitored wirelessly.

10 Claims, 8 Drawing Sheets

(56) References Cited

U.S. PATENT DOCUMENTS

| | | | |
|---|---|---|---|
| 2011/0220182 A1* | 9/2011 | Lin | H01L 31/048 136/251 |
| 2012/0048328 A1* | 3/2012 | Solon | G01D 4/002 136/244 |
| 2012/0113554 A1* | 5/2012 | Paoletti | H02H 3/28 361/63 |
| 2013/0033115 A1* | 2/2013 | Cutler | H01H 9/24 307/85 |
| 2013/0291922 A1* | 11/2013 | Bartos | H01L 31/048 136/244 |
| 2014/0070833 A1* | 3/2014 | Luebke | H02S 50/10 324/754.21 |
| 2014/0071563 A1* | 3/2014 | Solon | H02H 3/17 361/2 |
| 2014/0327325 A1* | 11/2014 | Solon | H01H 47/002 307/113 |
| 2015/0109083 A1* | 4/2015 | Solon | H02G 1/00 336/65 |
| 2015/0177288 A1* | 6/2015 | Foerster | H05K 5/0017 324/126 |
| 2015/0194801 A1* | 7/2015 | Schripsema | H02H 3/18 361/84 |
| 2015/0333503 A1* | 11/2015 | Bermingham | H02H 7/268 361/62 |

* cited by examiner

MASTER RECOMBINER BOX WITH WIRELESS MONITORING CAPABILITY

CROSS-REFERENCE TO RELATED APPLICATIONS

This application claims priority from the United States provisional patent application entitled DISCONNECT CABINET AND RECOMBINER BOX WITH WIRELESS MONITORING CAPABILITY, which was filed on May 3, 2013, and assigned the Ser. No. 61/818,940.

This application is being filed concurrently with a United States Utility patent application entitled DISCONNECT CABINET WITH WIRELESS MONITORING CAPABILITY, which also claims priority from the provisional patent application entitled DISCONNECT CABINET AND RECOMBINER BOX WITH WIRELESS MONITORING CAPABILITY, which was filed on May 3, 2013, and assigned the Ser. No. 61/818,940. This co-pending application has a Ser. No. 14/513,135, and is hereby incorporated by reference in its entirety.

BACKGROUND

Field

The present invention relates generally to components used in solar fields, and more particularly, to a master recombiner box that combines DC power from downstream combiner boxes, monitors the power coming from those combiner boxes, and wirelessly transmits data related to that monitoring.

Related Art

A utility grade solar installation typically includes a plurality of solar collectors electrically grouped in an array. Direct Current (DC) power from each solar collector in the array is combined in a combiner box. A plurality of combiner boxes are electronically coupled to a recombiner box, which further combines the DC power. A plurality of recombiner boxes feed into an inverter, which converts the DC power into Alternating Current (AC) power, which is subsequently transmitted via power lines.

A variety of problems may decrease the power production of a given solar field. For example, individual solar collectors may be damaged, shaded, or have faulty connections such that power is not produced, is inadequately produced, or the generated power never makes it to the collector. Fortunately, technology for monitoring individual collectors, or small groups of collectors, is known. This technology is disclosed in U.S. patent application Ser. No. 12/871,234, having a filing date of Aug. 30, 2010, which is hereby incorporated by reference in its entirety.

Unfortunately however, this known technology is unable to handle high current, defined here as 100-600 amps. As a result, a solar field operator is effectively "flying blind" with respect to their combiner boxes in the field. Combiner box level disruptions are significant, and negatively affect the overall production and efficiency of the solar field.

Thus, there remains a need for a system that can monitor combiner box-level power. It is desirable that this system is capable of handling current in the 100-600 amp range. It is desirable that this system is integrated into a recombiner box. It is desirable that this system is capable of wirelessly transmitting data to a user. It is also desirable that this system optionally includes an integrated disconnect system.

SUMMARY OF THE INVENTIONS

The present invention combines and optionally monitors the current and voltage output of combiner and/or recombiner boxes in the solar field. This is accomplished using an assembly having multiple bus bars and sensors, as well as a control circuit board and antenna. The power from the solar field is combined in the present invention, then transferred to the inverter where it is changed from DC to AC. The invention optionally includes a disconnect switch for disconnecting the power from the output.

This invention is configured to monitor up to 20 different inputs from associated recombiner boxes. This allows a user to monitor the power output, so they know where there is a reduction in production and where maintenance is required. This invention can employ disconnect switches or circuit breakers to open the power supply circuit. The power is monitored by individual current transducers (CTs) and the monitoring control circuit board which are mounted inside a cabinet. The data from the CTs are encoded and transmitted by a radio frequency (RF) transmitter to the local computer on site. This data can then be evaluated from any computer on the internet with the correct security codes.

The ability to monitor up to 20 input circuits is accomplished by having fuses positioned on opposing sides of two bus bar. The monitoring is preferably performed on inputs having circuit protection fuses. This can be one or both inputs into the cabinet for a floating ground system. The monitoring system is powered by an external power supply.

One side of the power circuit is preferably routed through a disconnect device, and the other is attached to the bus bars at the bottom of the cabinet. A ground wire for each combiner box circuit can be landed.

DESCRIPTION OF THE PREFERRED EMBODIMENTS

Figure 1:
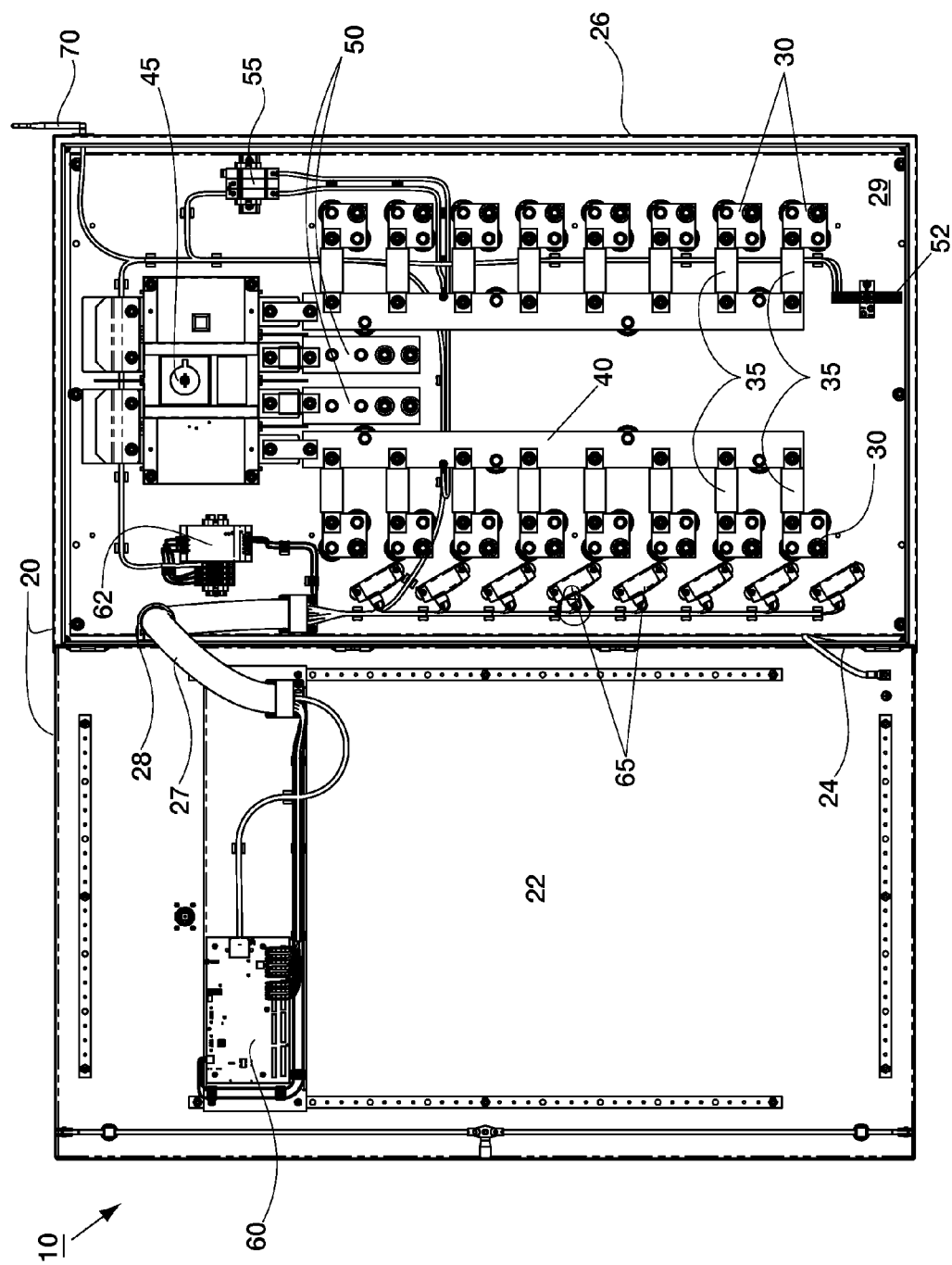
FIG. 1 is the front view of a recombiner box system having monitoring capability with the cabinet open.

In the following description, like reference characters designate like or corresponding parts throughout the several views.

The following terms will apply:
10—Recombiner box system;
20—Cabinet;
22—Door;
24—Hinge;
25—Safety shield;
26—Housing;
27—Conduit;
28—Conduit clamp;
29—Backpanel
30—Input bus bar;
35—Fuse;
40—Recombining bus bar;
45—Disconnect switch;

50—Output bus bar;
51—Unfused combining bus bar
52—Earth Ground bus bar
55—Surge protector;
60—Control circuit board;
62—Power supply;
63—Power input;
64—Current transducer input;
65—Current transducer ("CT");
68—Output to antenna;
70—Antenna;
72—Receiver; and
73—Processor.

As shown in FIG. 1, recombiner box system 10 is generally contained within cabinet 20 having housing 26 connected at hinge 24 to door 22. Housing 26 is preferably mounted to a substantially horizontal and stationary surface, such as a floor. Door 22 is configured to mate with housing 26 in order to provide a substantially enclosed space there within, such that internal structures are protected from ambient environment and people.

The majority of components and structures of the system are positioned within housing 26, with the exception of control circuit board 60, which is preferably mounted on door 22.

DC power from individual combiner boxes (not shown) enters system 10 at input bus bars 30. One combiner box is coupled with one input bus bar 30. A given system can be configured to have up to 20 input bus bars, corresponding with 20 combiner boxes. Each input to the bus bar is routed through an individual current transducer (CT) 65. In this manner, each power output of each upstream combiner box is monitored. Power travels from input bus bar 30, through fuse 35, to recombiner bus bar 40, where power is combined with power coming from other input bus bars of the system.

A suitable input bus bar is copper bus bar sized to carry the required current plated to prevent corrosion. A suitable fuse is SPFJ Series, Littlefuse, Chicago, Ill. A suitable recombiner bus bar is copper bus bar sized to carry the required current plated to prevent corrosion.

Power from recombiner bus bar 40 goes to output bus bar 50, then to an inverter (not shown) for conversion to AC power. Disconnect switch 45 is preferably positioned in pathway between recombiner bus bar 40 and output bus bar 50. It is preferable to use a linkage assembly with disconnect switch, such as that disclosed in concurrently filed U.S. application Ser. No. 14/513,135, previously noted as incorporated herein.

As shown in FIG. 1, system 10 preferably also includes power supply 62 for powering control circuit board 60, and surge protector 55. A suitable power supply is CP-E series by ABB, Wichita Falls, Tex. A suitable surge protector is DS50PVS series by Citel, Miramar, Fla. Conduit clamp 28 provides a pathway for conduit 27 between door and housing, best shown in FIG. 1. The ground wire is noted in FIG. 8.

Figure 2:
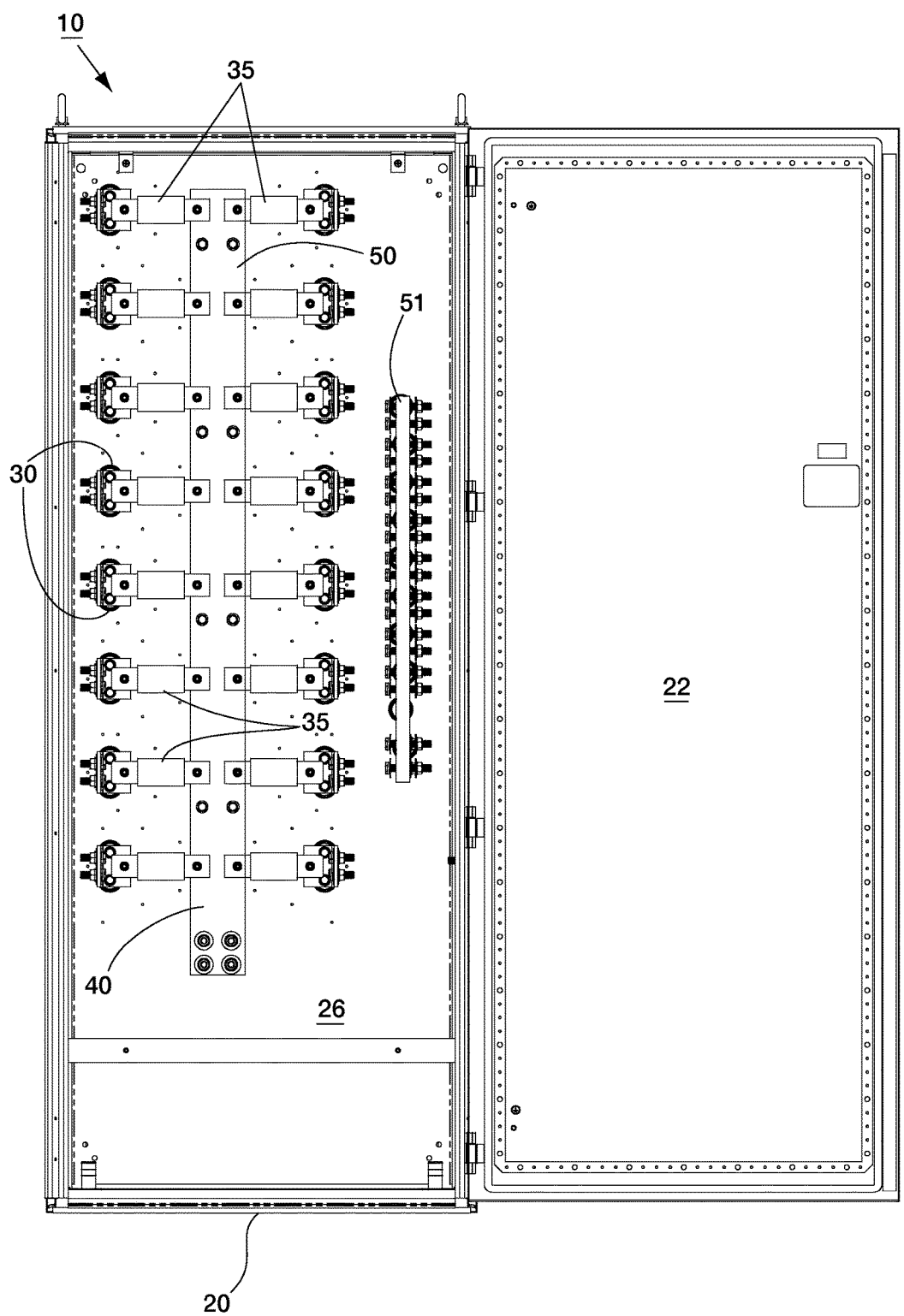
FIG. 2 is the front view of a recombiner box system without monitoring capability with the cabinet open.

As shown in FIG. 2, an embodiment of the present invention is a recombiner box without monitoring capability. More specifically this embodiment is substantially the same as the embodiment depicted in FIG. 1, but lacks power associated structures such as disconnect switch 45, control circuit board 60, CTs 65, and power supply 62. Labels (not numbered) are preferably positioned to the left of hinge.

Figure 3:
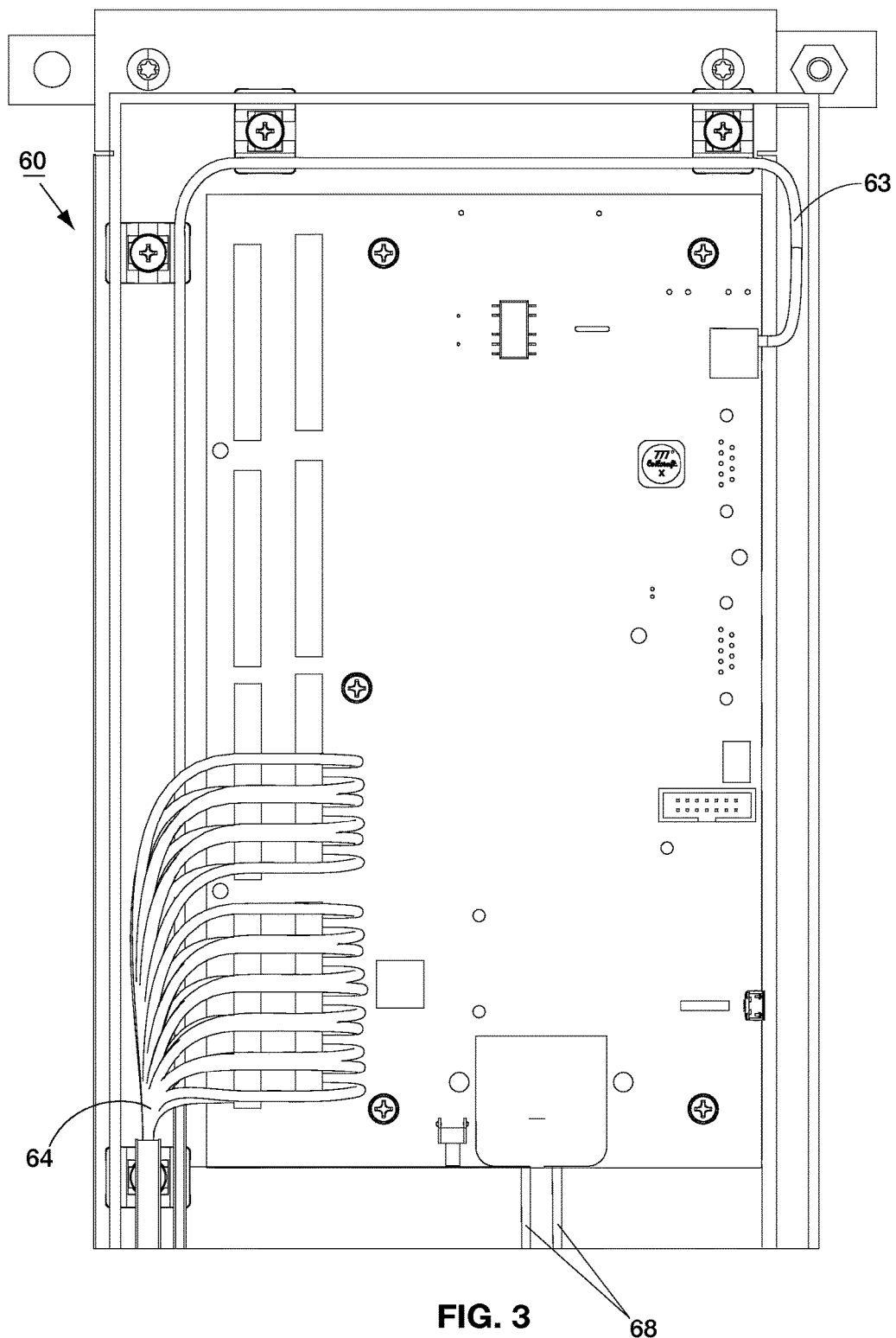
FIG. 3 is a control circuit board with associated structures.
Figure 4:
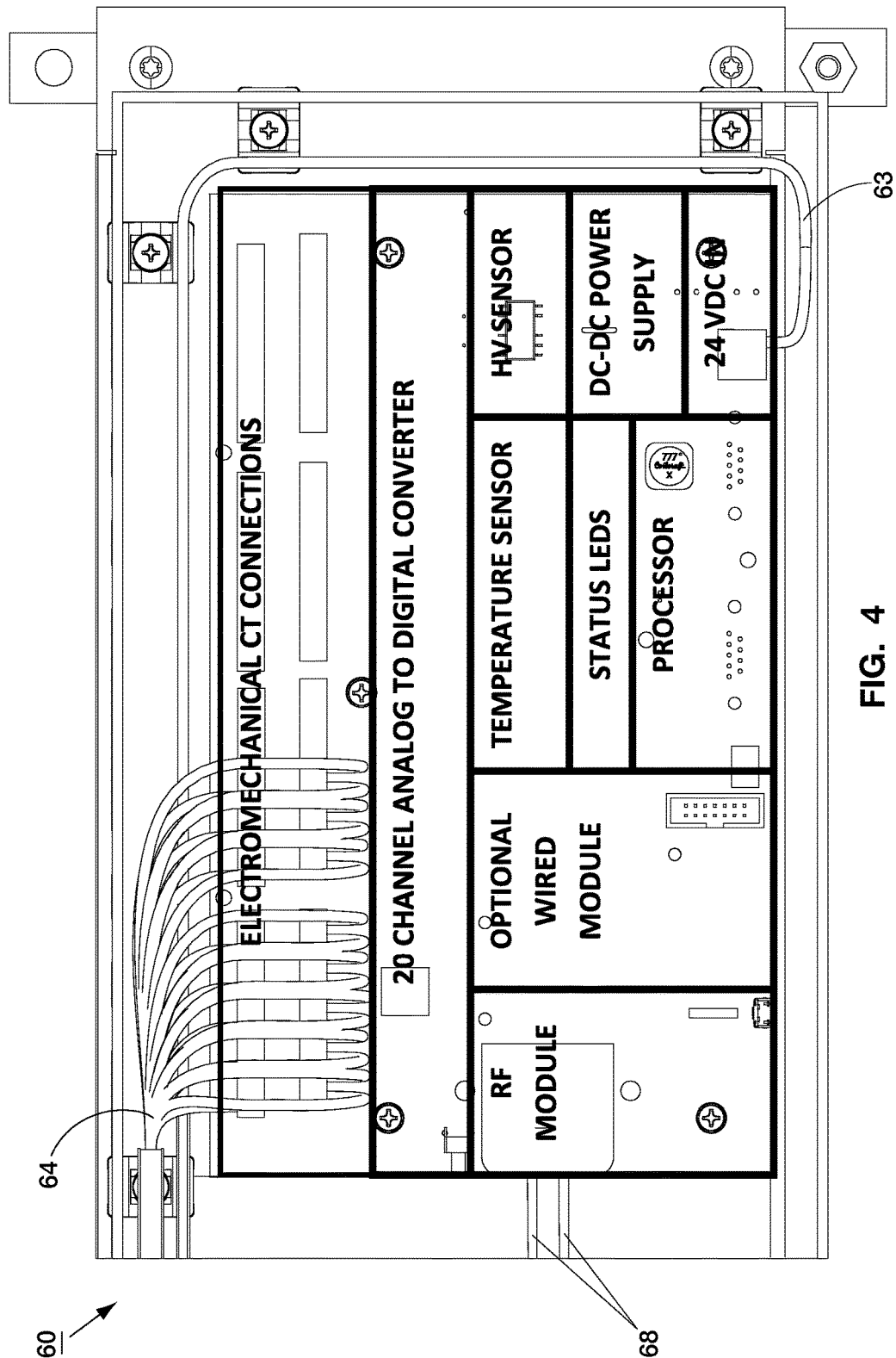
FIG. 4 is a schematic of a control circuit board.

In the monitoring embodiment of FIG. 1, the current and voltage of each combiner box that is coupled to the system is measured by an associated CT 65. Block diagram of FIG. 4 shows how voltage is measured. As shown in FIG. 3, control circuit board 60 receives CT input 64, and this information is ultimately transmitted through output to antenna 68. Antenna 70 is best shown in FIG. 1. In the manner conventional for RF transmissions, RF waves (not shown) are transmitted via antenna 70, and received by receiver 72 (not shown). Processor 73 (not shown) is communicatively coupled with receiver 72, and displays information such as decreases in current of a specific combiner box. Access to this information may be facilitated by web-based software, so a user can access data through the internet. Access may be password protected, so only authorized users can access the software or information. Different users may be granted different levels of access, depending on their need-to-know. Users may be alerted to certain events, such as significant decreases in power production, by text messages, email messages, instant messaging, or other means.

A schematic of control circuit board 60 is set forth in FIG. 4.

Figure 5:
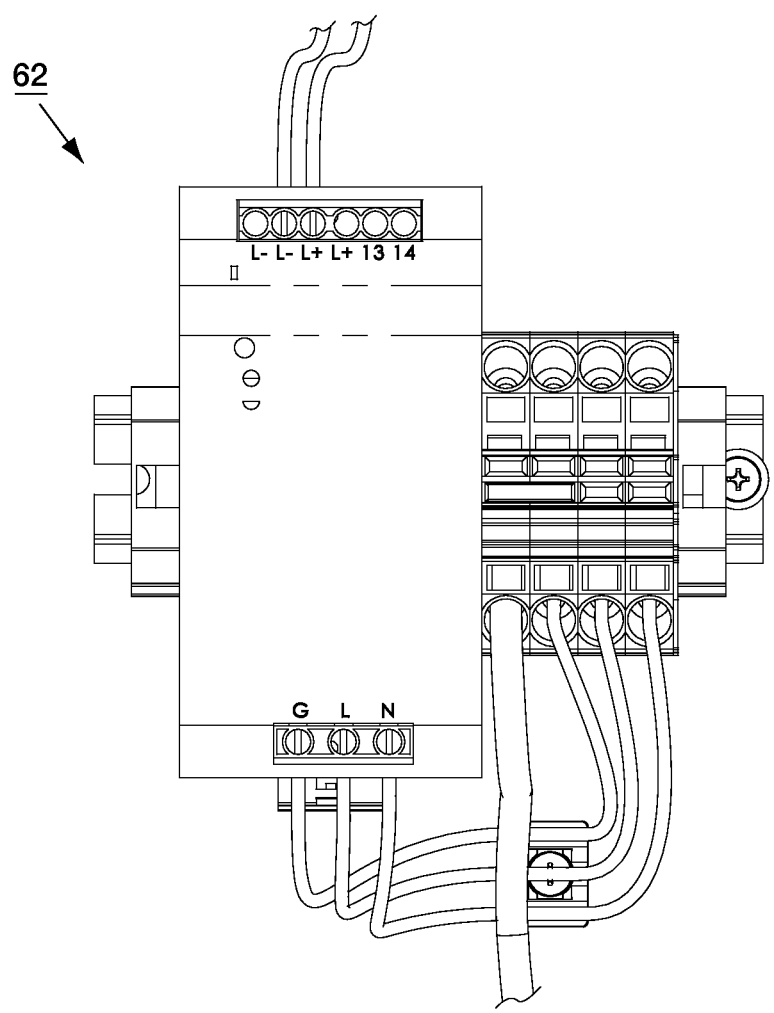
FIG. 5 is a power supply for the monitoring component of the system.

FIG. 5 is power supply 62 for running control circuit board 60. Power is supplied form an external source and stepped down to the level required for the circuit board.

Figure 6:
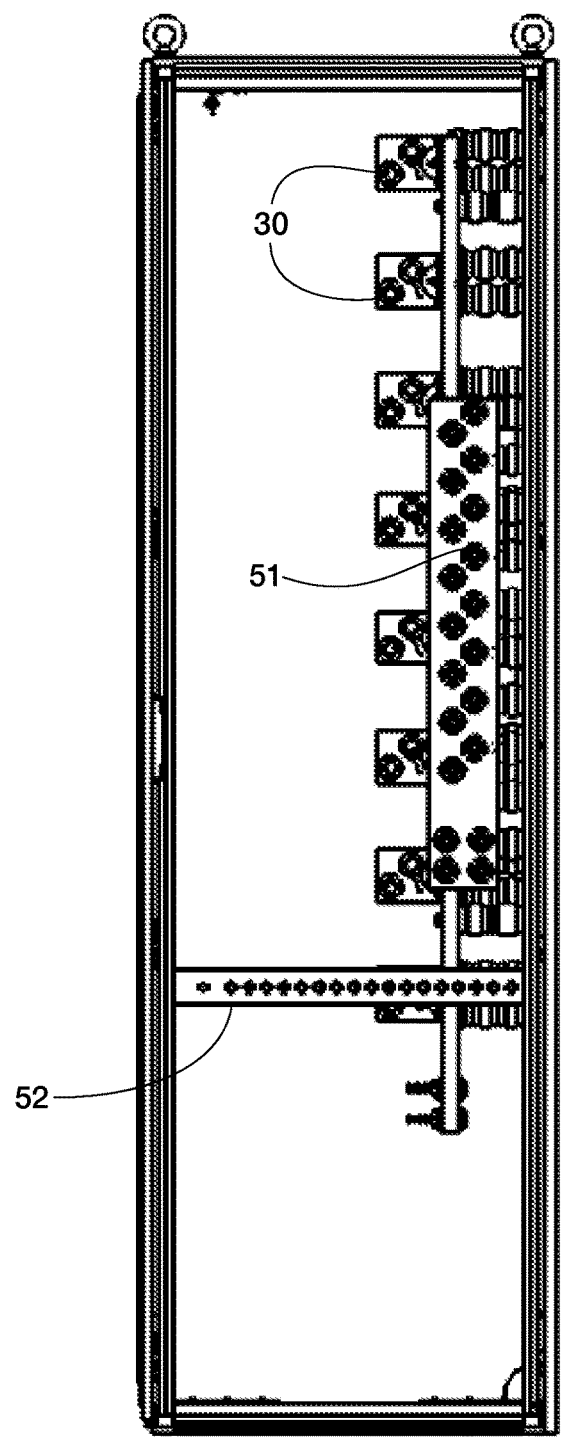
FIG. 6 is right side view of recombiner box without monitoring.

FIG. 6 depicts the right side of the cabinet with the side wall removed, and in particular, the earth ground bus bar and the unfused bus bar.

Figure 7:
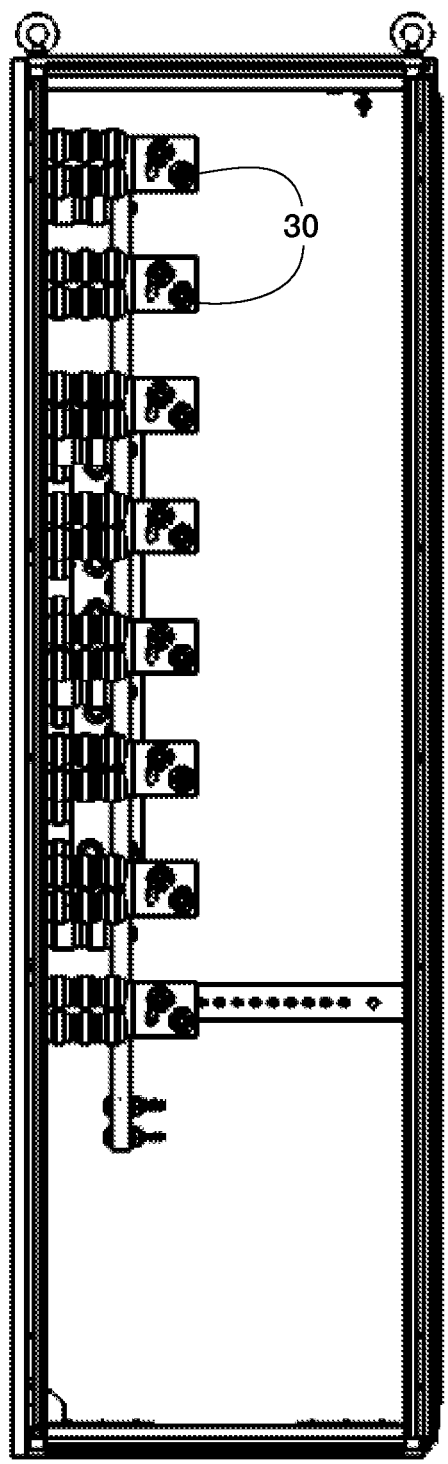
FIG. 7 is left side view of recombiner box without monitoring.

FIG. 7 depicts the left side of the cabinet with the side wall removed.

Figure 8:
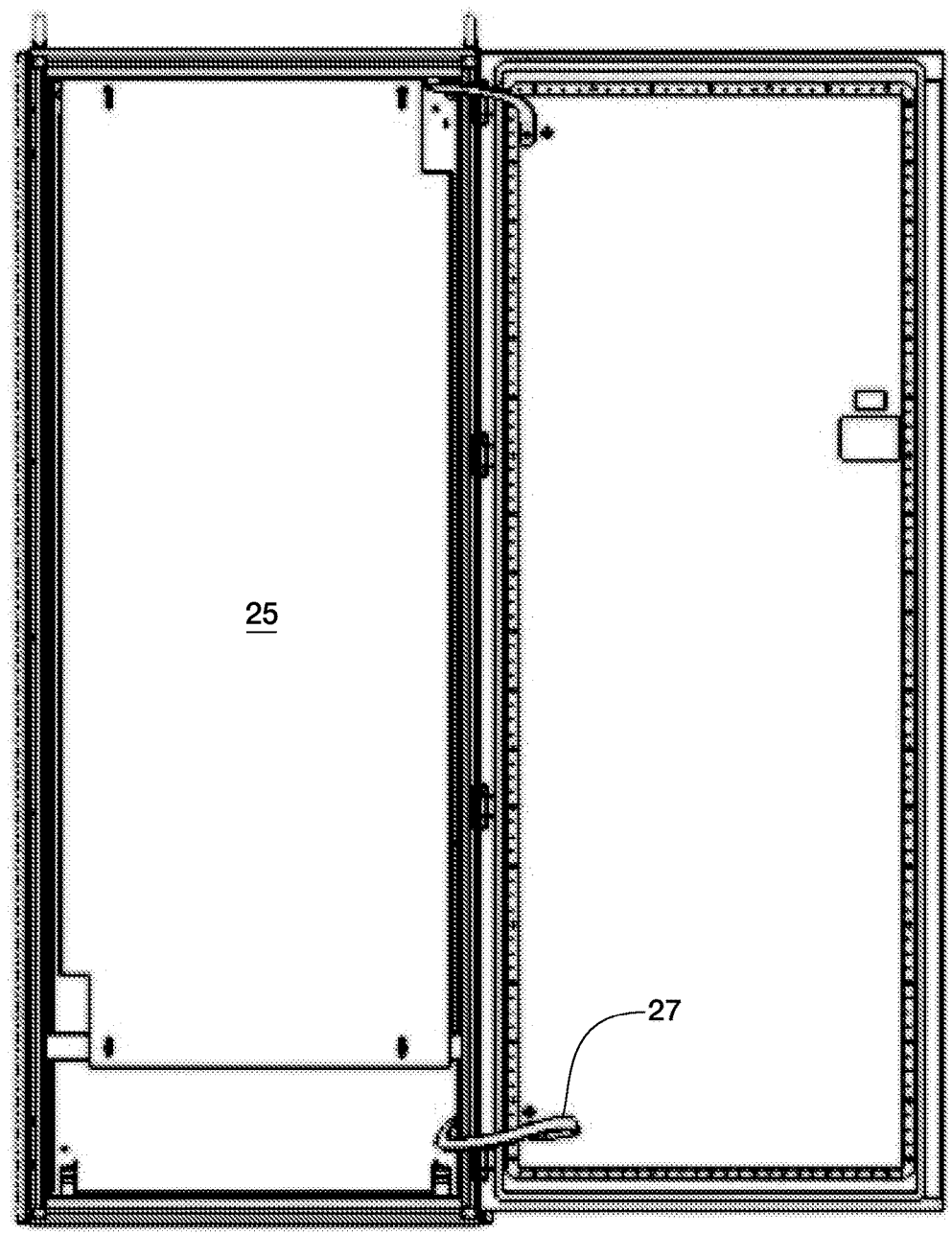
FIG. 8 is a front view of a recombiner box system with safety shields in place.

FIG. 8 depicts cabinet 20 with safety shields 25 attached. Safety shields 25 introduce a barrier between the high-powered system, and those who may accidentally come in contact with it. Once all the requisite connections are made, for example combiner boxes are electrically coupled to input bus bars, safety shields 25 are fitted in the inside areas of the housing and door, and the door is closed.

In use, a plurality of solar panels is connected to a combiner box. A plurality of combiner boxes is connected to a recombiner box of the present invention. The present invention receives power from each individual combiner box via the input bus bars. The input bus bars include current transducers that monitor the power of the corresponding combiner box. The power to the input bus bars is combined at the recombiner bus bar. The recombiner bus bar power is transmitted to the ouput bus bar, and subsequently goes to an inverter. The current transducers are connected to a control circuit board, which is coupled to an antenna for transmitting data via an RF signal. This RF signal is received at a location away from the recombiner box, processed, and alerts can be sent if appropriate. An example of an alert would be a user receiving a text message that there is a 98% reduction in power generated at combiner box ABC123.

Certain modifications and improvements will occur to those skilled in the art upon a reading of the foregoing description. By way of example, while this system is specifically designed for high amperage (100-600 amps) applications, it could be used with lower amperage applications. With modifications it could be used with even higher amperage (>600 amps) applications. Also, as used herein, "combiner boxes" and "recombiner boxes" may be interchangeable, depending on the configuration of a specific solar field. Also, the software and algorithms that analyze and display information can vary and have very simple, or very elaborate features. Also, recombiner box could provide arc fault detection. The system is able to deploy in positively grounded, negatively grounded, floating grounded, and bi-polar systems with minor internal modifications.

It should be understood that many modifications and improvements have been deleted herein for the sake of conciseness and readability but are properly within the scope of the following claims. It should also be understood that the illustrations are for the purpose of describing a preferred embodiment of the inventions and are not intended to limit the inventions thereto. It should also be understood that approximations allow variances of +/−10%, unless otherwise noted. As used herein, "substantially" and the like shall mean that the statement is generally true, notwithstanding minor variances due to materials, unusual properties or situations, irregularities, human limitations, expected human behavior, and so forth. By way of example, "substantially permanently attached" would mean an attachment would sustain regular usage, but could be separated through unusual effort. It should also be understood that all ranges set forth inherently include the endpoints themselves, as well as all increments, therebetween.

I claim:

1. A recombiner box system comprising:
   A) A cabinet including a door and a housing separated by an elongated hinge;
   B) A control circuit board engaged with said door;
   C) A first set of a plurality of input bus bars engaged with said housing, each input bus bar coupled with exactly one combiner box;
   D) A second set of a plurality of input bus bars engaged with said housing;
   E) A first recombiner bus bar engaged with said first set of input bus bars;
   F) A second recombiner bus bar engaged with said second set of input bus bars; and
   G) a single disconnect switch coupled with said first recombiner bus bar and said second recombiner bus bar, wherein the capacity of the system is 100-600 amps, and wherein said door can close to form a substantially enclosed and protected system.

2. The recombiner box of claim 1 further including a plurality of fuses each positioned between each of said input bus bars of said first set of a plurality of input bus bars and the associated recombiner bus bar.

3. The recombiner box of claim 1 further including a plurality of current transducers, each one of said current transducers coupled with each one of said input bus bars of said first set of a plurality of input bus bars.

4. A solar energy installation comprising:
   A) A first plurality of solar panels electrically coupled to a first combiner box;
   B) A second plurality of solar panels electrically coupled to a second combiner box;
   C) A recombiner box including a single cabinet containing both a first input bus bar electrically coupled to said first combiner box, and a second input bus bar electrically coupled to said second combiner box;
   D) A first recombiner bus bar electrically coupled to said first input bus bar and said second input bus bar, said first recombiner bus bar contained within said cabinet;
   E) A first output bus bar electrically coupled to said first recombiner bus bar;
   F) A disconnect switch positioned in the electrical path between said first output bus bar and said first recombiner bus bar;
   G) A second output bus bar electrically coupled to a second recombiner bus bar;
   H) A first current transducer electrically coupled to said first input bus bar, and a second current transducer electrically coupled to said second input bus bar;
   I) A control circuit board electrically coupled to said first and second current transducers;
   J) An antenna capable of transmitting an RF signal, said antenna communicatively coupled to said control circuit board;
   K) A receiver capable of receiving said RF signal, said receiver positioned away from said antenna; and
   L) A processor for analyzing said RF signal, said processor communicatively coupled to said receiver.

5. The solar energy installation of claim 4 further including at least one alert device communicatively coupled to said processor, said alert device selected from a telephone, a pager, a personal computer, a laptop, a tablet, and combinations thereof.

6. The solar energy installation of claim 4 further including a single inverter electrically coupled to said first recombiner bus bar and said second recombiner bus bar.

7. The solar energy installation of claim 4 wherein said disconnect switch is positioned in the electrical path between said second output bus bar and said second recombiner bus bar.

8. A method of configuring a solar energy installation comprising the steps of:
   A) Electrically coupling a first plurality of solar panels to a first combiner box;
   B) Electrically coupling a second plurality of solar panels to a second combiner box;
   C) Electrically coupling said first combiner box and said second combiner box to respective first and second input bus bars in a recombiner box;
   D) Electrically coupling said first and second input bus bars with a recombiner bus bar;
   E) Electrically coupling said recombiner bus bar with an output bus bar;
   F) Engaging a disconnect switch in the electrical pathway between said recombiner bus bar and said output bus bar;
   G) Measuring the current through said first input bus bar with a first current transducer;
   H) Measuring the current through said second input bus bar with a second current transducer;
   I) Transmitting measurement data as an RF signal; and
   J) Analyzing said data to identify decreased power output at a first combiner box or a second combiner box.

9. The method of claim 8 further including the step of alerting a user of decreased power outage at a pre-determined threshold.

10. The method of claim 8 further including the step of electrically coupling said output bus bar with an inverter.

* * * * *